United States Patent [19]

Agrawal et al.

[11] 4,270,027
[45] May 26, 1981

[54] TELEPHONE SUBSCRIBER LINE UNIT WITH SIGMA-DELTA DIGITAL TO ANALOG CONVERTER

[75] Inventors: Bhagwati P. Agrawal, Shelton; Kishan Shenoi, Fairfield, both of Conn.

[73] Assignee: International Telephone and Telegraph Corporation, New York, N.Y.

[21] Appl. No.: 98,103

[22] Filed: Nov. 28, 1979

[51] Int. Cl.³ .............................................. H04M 1/00
[52] U.S. Cl. .......................... 179/81 R; 179/15.55 R; 179/2 DP
[58] Field of Search ............. 179/15.55 R, 2 C, 2 DP, 179/81 R; 370/29; 364/723, 724

[56] References Cited

U.S. PATENT DOCUMENTS

| | | | |
|---|---|---|---|
| 3,542,956 | 11/1970 | Sekimoto | 370/29 |
| 3,924,077 | 12/1975 | Blakeslee | 370/29 |
| 3,973,081 | 8/1976 | Hutchins | 179/15.55 R |
| 4,020,332 | 4/1977 | Crochiere et al. | 364/723 |
| 4,100,373 | 7/1978 | Perkins | 179/2 C |
| 4,109,110 | 8/1978 | Gingell | 340/347 DD |
| 4,124,773 | 11/1978 | Elkins | 179/2 DP |
| 4,150,260 | 4/1979 | Kamata | 179/81 R |

OTHER PUBLICATIONS

P. Van Gerwen, et al., "A New Type of Digital Filter etc.", IEEE Trans. on Comm., Feb. 1975, pp. 222-234.
M. Tubiana, "Digital Filter Having Integral Coefficients", IBM Tech. Discl. Bull., Mar. 1976, pp. 3322-3324.

Primary Examiner—Charles E. Atkinson
Assistant Examiner—E. S. Kemeny
Attorney, Agent, or Firm—John T. O'Halloran; Jeffrey P. Morris

[57] ABSTRACT

A digital to analog converter is employed in the digital line circuit of a telephone system and operates to convert a digital signal indicative of an analog speech signal back into a replica of the analog signal. The converter operates with an interpolated input digital signal to detect by means of a sign bit, the characteristic of an input digital word as being indicative of a positive or negative level. An error correcting signal is provided by the converter which is added to the next digital word to provide a compensated word having a sign bit determined by the remainder and the sign bit of the previous digital word. This word is then processed in sequence to produce an output pulse stream from the sign detector indicative of successive positive or negative values as defined by the input digital words, each of which are modified according to the error correcting signal.

5 Claims, 11 Drawing Figures

TELEPHONE SUBSCRIBER LINE UNIT WITH SIGMA-DELTA DIGITAL TO ANALOG CONVERTER

CROSS REFERENCES TO RELATED APPLICATIONS

Adaptive Digital Echo Cancellation Circuit, by B. Agrawal and K. Shenoi, Ser. No. 020,593, filed Mar. 14, 1979, Gain Control Apparatus for Digital Telephone Line Circuits, by B. Agrawal and K. Shenoi, Ser. No. 098,110, filed Nov. 28, 1979, Interpolation Apparatus for Increasing the Word Rate of a Digital Signal of the Type Employed In a Digital Telephone System, by K. Shenoi and B. Agrawal, Ser. No. 098,105, filed Nov. 28, 1979, and Decimator Apparatus for Decreasing the Word Rate of a Digital Signal of the Type Employed in Digital Telephone Systems, by K. Shenoi and B. Agrawal and I. Chu, Ser. No. 098,094, filed Nov. 28, 1979.

FIELD OF INVENTION

This invention relates to digital-to-analog (D/A) converters and more particularly to a digital-to-analog converter employed in a telephone line circuit and using a sigma-delta modulation scheme.

BACKGROUND OF INVENTION

In modern day telephone communication systems, digital data is employed for transmission via a switching matrix to various subscribers associated with the system. The use of digital data enables efficient transmission and enables the various system modules to be implemented by integrated circuit configurations, which are particularly well suited for the fabrication of digital circuitry.

The function of a D/A converter is to operate on a digital word or number and convert it to an analog voltage or current proportional to or indicative of the digital word. In a typical telephone system, subscribers communicate via the transmission of analog signals. In the digital telephone system, the analog signals are converted into digital signals. Hence, prior to application of a received digital signal to a subscriber, one converts the signal back to an analog signal and hence employs a digital to analog converter. A D/A converter should preferably provide a continuous analog output, which is manifested by a smooth curve drawn through the sample points.

Many techniques exist in the prior art for the conversion of digital signals to analog signals and many such techniques and apparatus are well known. Essentially, the prior art employed ladder networks which are switched to hold each sample constant for one period. This technique suppresses high frequency components in the output by use of a low pass filter. However, the ladder circuitry is extremely expensive as it requires high tolerance, tracked components and as such are not compatible with integrated circuit technology.

Hence, various alternatives have been proposed such as digital techniques employing a rate multiplier. In such schemes, a rate multiplier is used to produce an output pulse stream having a mean density proportional to a clock frequency times the input digital number. The input number is changing at each sample instant and hence, the clock frequency must be equal to the sampling frequency times the number of possible levels in the input number. For example, a 12 bit linear PCM signal at an 8 KHz sampling rate would require a clock frequency of about 32 MHz (megahertz). This rate is extremely high and hence, to compromise, one converts the PCM signal to sign, magnitude and scaling components. The magnitude is applied to a rate multiplier operating at a lower clock frequency, the output of which is scaled and signed by analog means.

Another useful technique is described in U.S. Pat. No. 4,109,110 entitled DIGITAL TO ANALOG CONVERTER issued on Aug. 22, 1978 to M. J. Gingell and assigned to the International Standard Electric Corporation and employs digital means for increasing the sampling rate of an input digital signal. The increased rate is of a lower number of bits per sample to enable final digital to analog conversion to be facilitated by a relatively simple digital to analog converter in conjunction with a rate multiplier, to provide an output pulse stream having a mean density proportional to the analog signal amplitude. This output stream is passed through a low pass filter to yield the analog signal. The system described in this patent is applicable for use in telephony systems using PCM signals.

Such converters and others operating at an 8 KHz sampling rate or frequency require highly accurate specifications for the analog filters as well as in the case of the ladder arrangements, a large number of bits per sample. In a telephone system, these factors add additional expense to the line circuit.

Thus, the technique described in the above patent uses a digital interpolator to raise or increase the word rate to 256 KHz at 12 bits and then to reduce the word length to 4 bits. The rate multiplier operates with the 256 KHz signal at 4 bits to implement a pulse density modulator operating at a clock rate of 4,096 KHz and is followed by a low pass filter.

It would be desirable to eliminate the rate multiplier in a digital-to-analog conversion scheme and to provide a pulse stream which can be directly applied to a low pass filter to retrieve an accurate representation of the analog signal.

An object of the present invention is to provide an improved D/A converter particularly adapted for use in a digital telephone line circuit and capable of being implemented with digital integrated circuitry. The digital to analog converter to be described is therefore compatible with integrated circuit techniques and hence, enables digital to analog conversion in economical and reliable configurations.

BRIEF DESCRIPTION OF THE PREFERRED EMBODIMENT

Apparatus for converting a digital signal to an analog signal, said digital signal having a given word rate and comprising a plurality of digital words each having the same number of given bits, and each indicative of the weighted value of an analog signal, with at least one bit in each word indicative of a sign bit indicating whether said word and therefore said value is positive or negative, comprising, adding means for receiving each digital word at a first input thereof, one different from the other according to said word rate, a second input adapted to receive an error correcting signal to provide at an output, another digital word having a sign bit indicative of a remainder of a last digital word, sign detecting means responsive to said another digital word to provide an output pulse when the sign of said word is indicative of one value as positive or negative, said output pulse indicative of the value of said analog signal, feedback control means responsive to the sign of said digital word for providing an inverted sign for adding said inverted sign to said another digital word at the output of said feedback control means, means coupling the output of said feedback control means to said second input of said adding means to cause each successive digital word as applied to said first input to be modified by said output of said feedback control means, whereby each successive digital word is modified by said output of said feedback control means based on said sign of said previous word to cause said sign detecting means to provide said output pulse for each word as modified, having said sign bits of said one value, low pass filter means coupled to the output of said sign detecting means for providing a replica of said analog signal according to said output pulses.

BRIEF DESCRIPTION OF THE DRAWINGS

Above-mentioned and other features and objects of this invention will become more apparent by reference to the following description taken in conjunction with the accompanying drawings, in which.

DETAILED DESCRIPTION OF INVENTION

Figure 1:
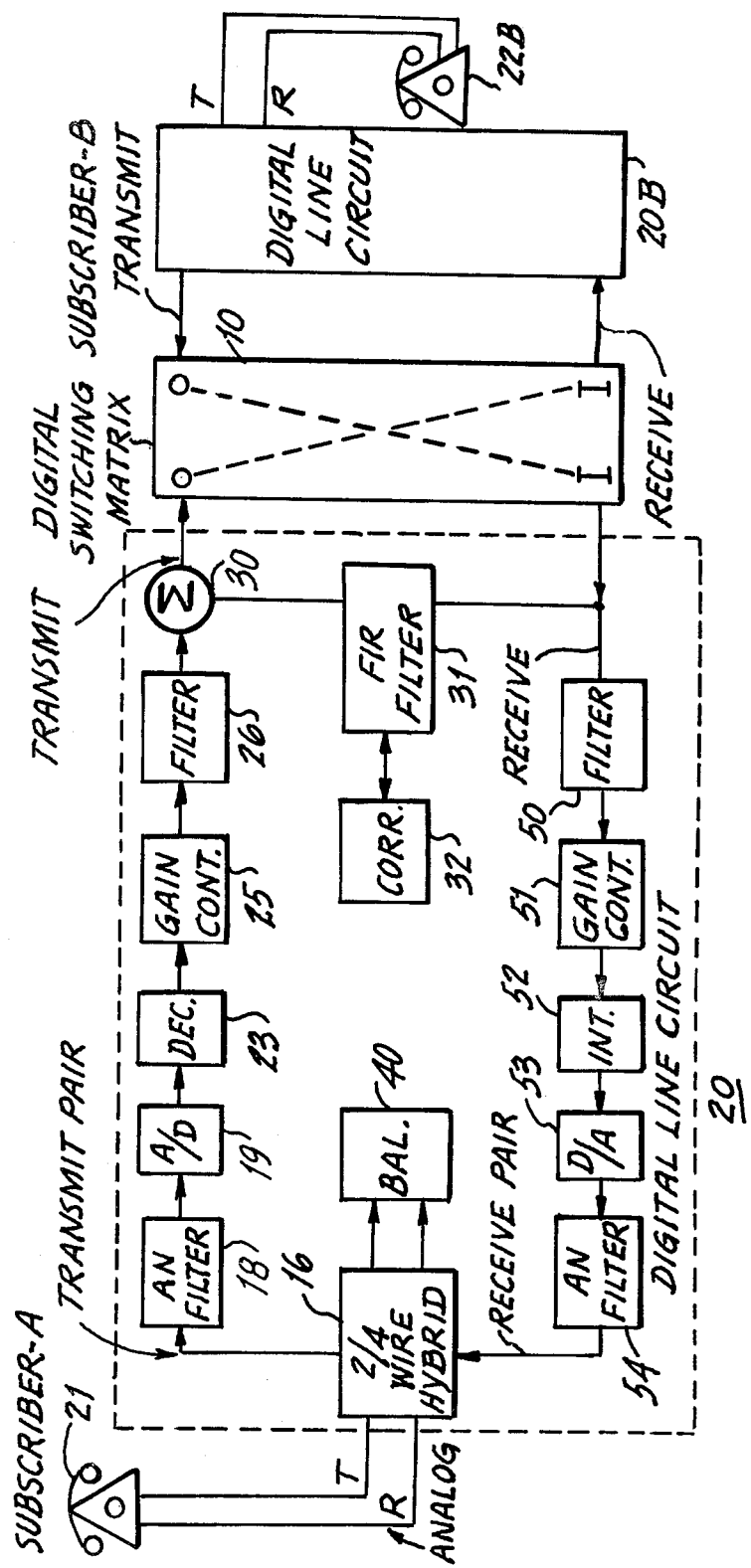
FIG. 1 is a simplified block diagram of a pair of telephone subscriber line circuits employing digital techniques and connected one to the other via a digital switching matrix.

Referring to FIG. 1, there is shown a telephone line circuit as employed in a digital telephone communications system, particularly adaptable for the utilization of a digital to analog converter according to this invention.

Essentially, a single subscriber A is connected via a digital switching matrix 10 to another subscriber B. Each subscriber as A has a separate line circuit 20 associated with his subset and to enable communications between the parties. While subscribers A and B are shown associated with subsets as 21 and 22, it is understood that the subscribers could be trunk locations for connecting to other central offices and so on and as such, would also require a line circuit as 20. In order to simplify the explanation, a single line circuit 20 is shown for subscriber A and it is understood that subscriber B has an identical line circuit 20B as does the plurality of additional subscribers not shown in FIG. 1.

For an example of a digital line circuit employed in a switching system, reference is had to U.S. Pat. No. 4,161,633 entitled SUBSCRIBER LINE-TRUNK CIRCUIT issued on July 17, 1979 to Robert Treiber and assigned to the International Telephone and Telegraph Corp., the assignee herein.

The telephone subset 21 associated with subscriber A is coupled via a two-wire analog line including tip (T) and ring lines (R) to a two-to-four wire hybrid or converter circuit 16. The hydrid 16 is a well known component and essentially connects the two wire analog line to a four wire line. Hence, the output of the hybrid 16 is coupled to two wires shown as a single line and designated as a transmit pair and two wires, (single line) designated as a receive pair. A description of suitable hybrid circuits and operation may be had by referring to a text entitled REFERENCE DATA FOR RADIO ENGINEERS, Sixth Edition (1975) Howard W. Sams, pages 35–16 through 35–20. A digital hybrid circuit is described in copending U.S. patent application, Ser. No. 903,458 filed on May 8, 1978 and assigned to the assignee herein.

The transmit pair via hybrid 16 is coupled to the input of an analog filter 18. As one can ascertain, the signal as propagating from the hybrid 16 through the filter 18 is an analog signal. The output of the filter 18 is coupled to the input of an analog to digital converter (A/D) 19. The analog to digital converter 19 may be a pulse code modulator (PCM) device and operates to sample and digitize the analog output signals from filter 18 to provide a digital signal at its output. While one may employ a pulse code modulated signal (PCM), other techniques for analog to digital conversion are applicable. The PCM or digital signal is provided at the output of the A/D 19. This digital signal is applied to the input of a decimator module (DEC) 23. Essentially, the decimator module 23 is a digital filter which functions to decimate or reduce the output word rate of a digital signal applied to its input. In the above discussion, it was indicated that the analog to digital converter 14 is a PCM device, but other types of A/D converters could be employed as well.

In any event, depending upon the signal, a decimator as 23 may be employed to filter or provide attenuation to the digital signal for frequencies outside the band of interest or in this case, for frequencies outside the voice band (0–4 KHz). The decimator 23 is a second order recursive filter having a low pass filter characteristic. The decimator 23 provides a signal at its output at a lower word rate than the word rate available from the analog to digital converter 19. For example, the output digital signal from the A/D converter 19 may be at a sampling frequency (fs) or a word rate of 1.024 MHz with three bits per word. The output of the decimator 23 would be at a sampling frequency (fs) or a word rate of 32 KHz with a word length of 13+ bits per word.

The output of the decimator 23 is applied to a gain control circuit 25 which is the subject matter of a copending application entitled GAIN CONTROL APPARATUS FOR DIGITAL TELEPHONE LINE CIRCUITS by B. P. Agrawal et al, Ser. No. 098,110 filed on Nov. 28, 1979 and assigned to the assignee herein. The operation of the gain control is discussed at length in the referenced application.

The output of the gain control 25 is applied via a non-recursive audio filter 26 to a summing network 30.

The filter 26 has a bandwidth determined by the range of audio signals for transmission via the transmission path of the switching network 10. Another input to the summing network 20 is derived from a FIR filter 31. The filter 31 operates in conjunction with a correlator 32 to suppress or cancel the effects of echo in the line circuit. The operation and discussion of the echo suppression circuit has been described in detail in a copending application entitled ADAPTIVE DIGITAL ECHO CANCELLATION CIRCUIT, Ser. No. 020,543 filed on Mar. 14, 1979 for B. P. Agrawal et al and assigned to the assignee herein.

The output of the summer 30 is applied to the switching matrix 40 where it is directed when a connection is made by the switching system, to the receive input of a called subscriber as B. The subscriber's line circuit 20B is identical to the line circuit 20 shown for subscriber A. Hence, as can be ascertained the digital output signal from the transmit output (O) of the line circuit 20 of subscriber A is applied via the digital switching matrix 10 to the receive input (I) of the line circuit 20B. Examples of digital switching matrices as 10 can be had by referring to a copending application entitled MULTIPORT DIGITAL SWITCHING ELEMENT, Ser. No. 888,582, now U.S. Pat. No. 4,201,890, filed on Mar. 17, 1978 for A. J. Lawrence et al and assigned to the assignee herein.

The receive input (I) from the matrix 10 is coupled to the receive pair of the digital line circuit. In this manner, the digital signal from the transmit output (O) of the remote subscriber is directed to the input of a non-recursive audio filter 50, having the same bandpass characteristics as filter 26. The output of filter 50 is applied to the input of a gain control circuit 51 which essentially, is of the same configuration as gain control 25. The digital signal as controlled in gain at the output of gain control 51 is applied to an interpolator circuit 52. Basically, the interpolator 52 functions to increase the word rate of the digital signal.

As indicated, in the transmit path, the decimator 23 will decrease the word rate to 32 KHz at 13 bits or more per word. The interpolator 52 increases the word rate to 1.024 MHz at three bits or more bits per word or to another rate determined by the sampling rate employed. The output of the interpolator 52 is applied to the input of a digital to analog converter (D/A) 53. The D/A converter 53 operates to selectively sample the digital signal at the output of the interpolator 52 to provide at an output, an analog signal which is applied via the analog filter 54 to the hybrid 16. It is the digital to analog converter 53 which operates with the interplator that is the subject matter of this application and to be described in detail.

DIGITAL TO ANALOG CONVERSION IN A TELEPHONE LINE CIRCUIT

Referring to the above description of FIG. 1 and particularly referring to the receive path of line circuit 20, it is seen that subscriber A receives an input signal via the swtiching matrix 10 on the incoming (I) line coupled to the input of the filter 50. The signal is a digital signal as a PCM signal having a given word rate fs with a given number of bits N. In order to clearly understand the nature of the invention and as considered above, the incoming digital signal is assumed to be at a rate of 8 KHz with 13+ bits per word.

Figure 2:
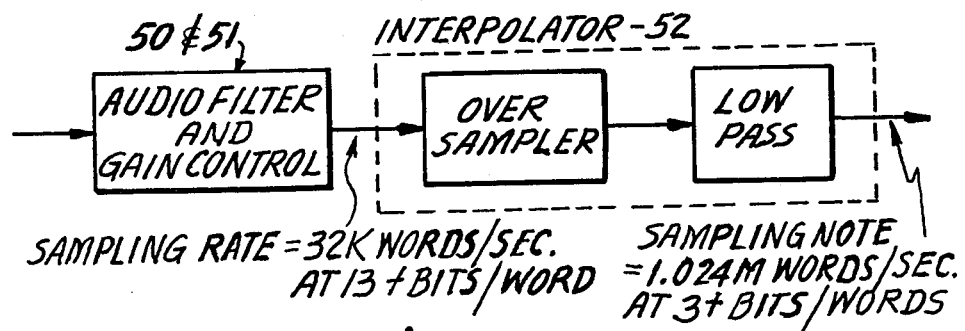
FIG. 2 is a simplified block diagram describing the operation of an interpolator as used in a digital line circuit.

The output of the audio filter 50 provides an effective word rate of 32 KHz with the same number of bits 13+ per word. This signal is applied to the gain control 51, which provides at its output, the received signal at the 32 KHz and with 13+ bits per word. The interpolator 52 receives the 32 KHz signal and increases the word rate to 1.024 MHz at three or more bits per word. Essentially, the interpolator 52 is the dual of the decimator 23. Essentially, the interpolator 52 is the cascade of an over sampler which inserts zero valued samples into the received signals and a low pass filter as depicted in FIG. 2.

The interpolator, as indicated, operates at a sampling rate of 1.024 MHz and affords a word rate increase of 32. The function of the interpolator is achieved by the insertion of zero-valued samples (zero-order hold), by repeating the current sample (first order hold), by linear interpolation as is done in hold circuits.

Now, if one considers that the analog signal which was originally converted to a digital signal in the transmit path of the line circuit 20B associated with subscriber B is a speech or voice signal occupying a bandwidth of about 0–4 KHz and that such signals are inherently low pass and smooth, one can gain a clearer understanding of how the digital to analog conversion process is easily implemented with a minimum of hardware capable of being integrated on line circuit integrated circuit modules or chips.

Since the audio signal is a highly correlated signal which has been sampled at a high rate, the incoming digital signal exhibits a high correlation between samples. This factor is an important consideration in the implementation of the digital to analog converter 53.

Figure 3:
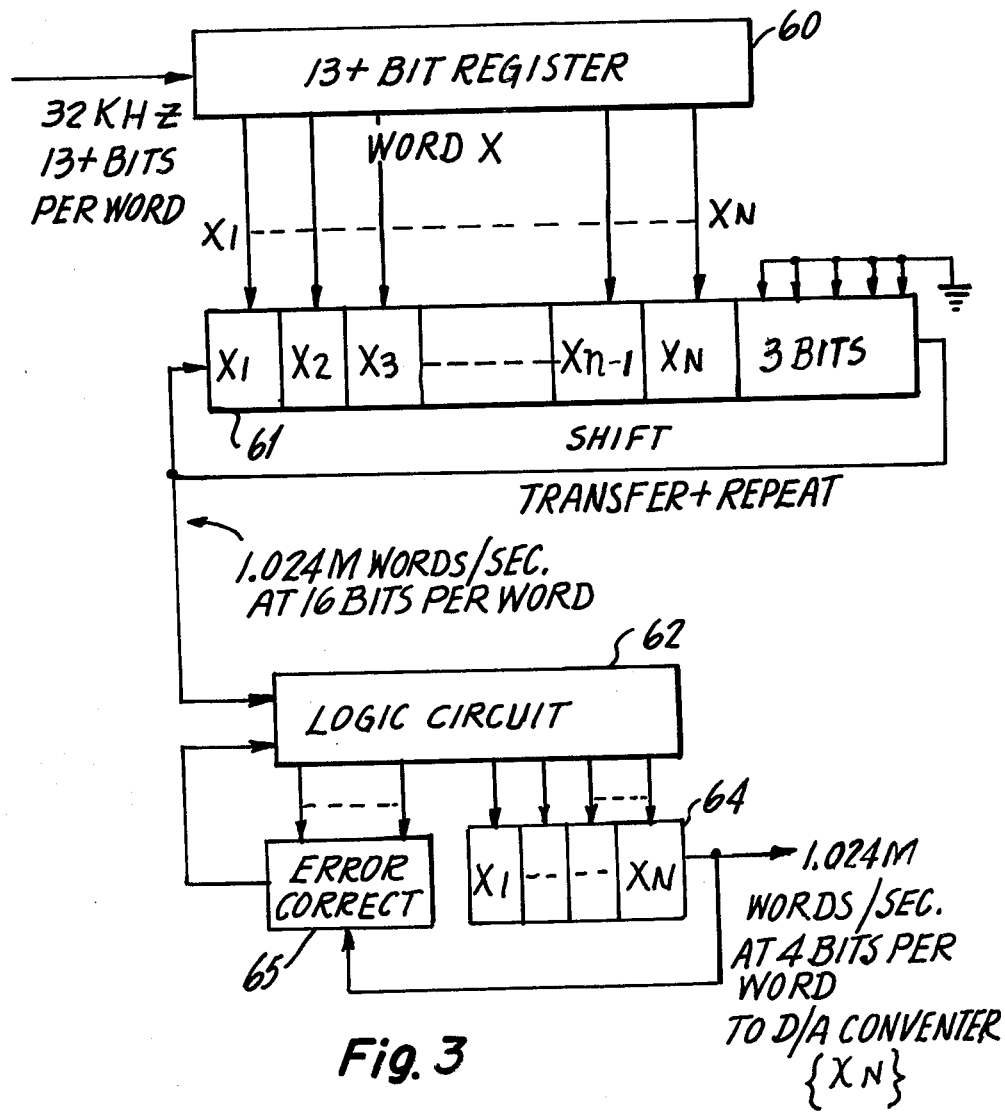
FIG. 3 is a block diagram of one type of interpolator which can be employed with this invention.

The interpolator 52 receives the highly correlated digital input signal and as indicated, increases the word rate, while reducing the number of bits. Referring to FIG. 3, an example of one type of interpolator is depicted, so one may understand the general configuration and operation. It is, of course, understood that alternate embodiments can be employed.

The incoming digital signal which, for example, is obtained from the gain control 51 of FIG. 1, is at a rate of 32 KHz with thirteen or more bits per word. As seen from FIG. 3, each word consisting of 32 bits is shifted into a shift register 60 which consists of a plurality of cascaded binary stages as is well known in the art. The register 50 transfers bits or loads a register 61. The transfer can occur in parallel. The bits designated as $X_I$ to $X_n$ constitute 13 bits, but as will be understood, more or less bits can be employed.

Register 61 in the example shown can constitute sixteen stages and hence, is operative to store 16 bits instead of 13. The least four stages would be set to zero as shown and hence four zeroes indicative of the least significant bits may be employed. The contents of the register 61 are shifted or transferred serially at a rate determined by the desired word rate increase afforded by the interpolator.

As one can ascertain from FIG. 3, the bits can be read out of register 61 serially at the rate of 1.024 M words per second. In any event, if one shifts the contents of the register 61 at a rate thirty-two times greater than the input rate, one effectively obtains the word X with the extra three bits or sixteen bits per word at a rate of 1,024 K words per second. It is understood that the use of the additional three bits is to simplify the clock arrangement and hence, an extra number of bits could be added to register 61 so that the number of bits in the word X plus the additional bits are equal to sixteen bits for each word.

The digital signal at the increased rate is applied to a circuit 62 designated as a logic circuit. Essentially, the logic circuit 62 may comprise a series of registers which operate on the 16 bits associated with each word at the word rate of 1.024 M words per second. There are many techniques for interpolating to produce a final output via the output register 64 having four bits per word at the higher word rate.

The logic circuit 62 contains error correcting circuitry 65. Basically, the error correcting circuitry functions to provide a signal indicative of the least significant bits of the thirteen bits used for each word at the input to register 60. From the above description, it is already known that the last three bits are zero and hence, these bits are always ignored by the logic circuit 62. Basically, the logic circuit 62 functions to provide a signal indicative of the nine least significant bits associated with each word. An error signal indicative of the magnitude of these bits is used by the logic circuit via the error correction circuit 65 to provide an error signal which is added to the next word. In this manner, the logic circuit operates to correct or compensate each successive word by the appropriate error signal to assure that the output words at four bits each and at the rate of 1.024 M words per second closely approximate the input words X.

As indicated above, each input word X having 13+ bits is indicative of one sampled value of an analog signal. Since the analog signal encompasses a relatively narrow bandwidth (0–4 KHz), the successive words X are of similar weights. This is an important aspect in providing digital to analog conversion in such a system.

As will be explained further, a main concern in digital to analog conversion is associated with the noise which the D/A converter will provide. Operation of the interpolator in conjunction with the D/A converter can effectively remove undesired noise from the system based on the sampling rate and the number of bits per word. If reference is made to U.S. Pat. No. 4,109,110 as indicated above, one can further discern various other types of interpolators which can be employed to increase the output word rate at a lower number of bits for application to a digital to analog converter.

As indicated, FIG. 3 is a rather general technique of performing interpolation to increase the word rate and reduce the number of bits of a digital signal. As one can ascertain, a simple approach used for performing interpolation would be to employ a single shift register as 60. The bits emanating from each digital word are stored in the register and shifted out at a rate determined by the desired word rate. Each word can then be truncated so that the four signal bits at the proper word rate are retrieved.

Figure 4:
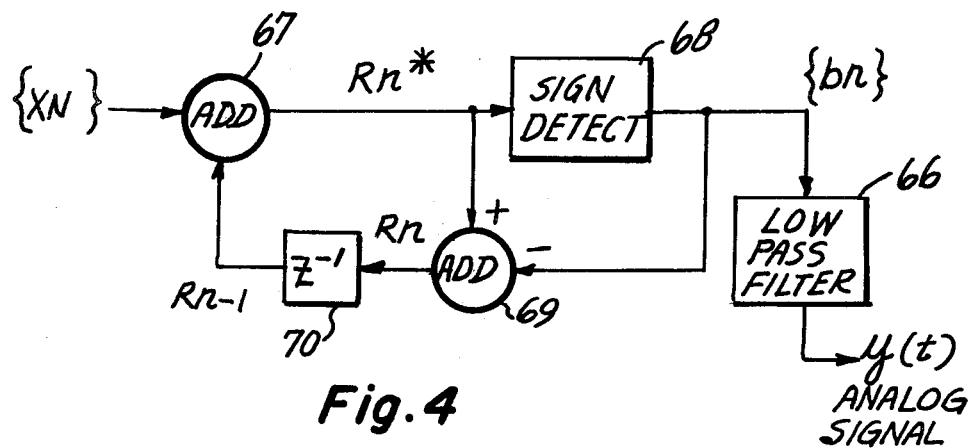
FIG. 4 is a circuit diagram of a digital to analog converter according to this invention.

In any event, a major object of the present invention is to provide a D/A converter which eliminates the necessity for a rate multiplier. Referring to FIG. 4, a simplified block diagram of a digital to analog converter according to this invention is shown. The input designated as $\{X_n\}$ is the signal derived from the output of the interpolator. The function of the digital to analog converter to FIG. 4 is to provide an output signal $\{b_n\}$ which is applied to a low pass filter 66 to produce an output analog signal.

By recognizing the inherent redundancy of the digital signal $X_n$, one can perform digital to analog conversion using a simple configuration shown in FIG. 4. It will be explained subsequently that this conversion is provided with a minimum of noise and is extremely useful and adaptable for converting digital signals into analog signals where the analog signals are indicative of the audio or voice spectrum.

Assuming the incoming word $X_n$ consists of four bits to be consistent with the general outline of the interpolator shown in FIG. 3. In any event, as will be ascertained, the input signal could be three bits or more. For purposes of operation, it is indicated that each word $X_n$ having a first bit or most significant bit of a binary zero indicates that the word represents a positive number. Alternatively, if the first bit is one, then the word is indicative of a negative number. Hence, as will be explained, the D/A converter shown in FIG. 4 is concerned with only one bit designated as the sign bit. If the sign bit is a zero, the number is positive and if it is a one, the number is negative.

The input word $X_n$, as indicated, is applied to one input of the adder circuit 67. The adder circuit 67 is a conventional adder, many examples of which are well known in the digital art and serves to add, in this example, four bit binary words. Adders capable of so performing are shown in a text entitled ARITHMETIC OPERATIONS IN DIGITAL COMPUTERS by R. K. Richards, published by D. Van Nostrand Co. (1955), Chapter 4 entitled BINARY ADDITION AND SUBTRACTION.

Essentially, the circuit shown in FIG. 4 operates with 2's complement arithmetic. In this manner, arithmetic operations are extremely simple as is well known in the art. As can be seen, the adder 67 receives another input from a feedback loop to be described and hence, the output of the adder 67 is designated as Rn*. This signal is applied to a sign detector circuit 68. The function of the sign detector 68 is extremely simple and operates as follows:

If the input to the sign detector has the first bit or the sign bit equal to zero, the sign detector will provide no pulse at the output. If, however, the sign bit or first bit of the input is a one indicative of a negative number, the sign detector 68 will provide a pulse at the output. In this manner, the output pulse stream $b_n$ will be a series of pulses at the output with one pulse or the absence of one pulse for each word as applied to its input.

To further clarify this, the output of the sign detector 68 provides a pulse for each word indicative of a negative number and provides no pulse for each word indicative of a positive number. Accordingly, the output of the sign detector 68 constitutes a pulse stream where the number and amount of pulses are a function of whether the input word indicated a positive or negative value.

The output bit developed by the sign detector 68 is inverted in polarity and added to the input Rn* via the adder 69. In this manner, the sign bit of Rn* is inverted to obtain at the output of adder 69, the word Rn. This word is delayed by means of the delay and register 70 having a digital transfer function $Z^{-1}$. The output of the register 70 is applied as a feedback signal to the adder 67 and for the next word. In this manner, the adder 67 provides an output signal having a sign bit determined by the remainder of the previous word.

The circuit of FIG. 4 is extremely simple to implement and one skilled in the art should have no difficulty in providing the hardware necessary to fabricate the circuit shown in FIG. 4.

Figure 5:
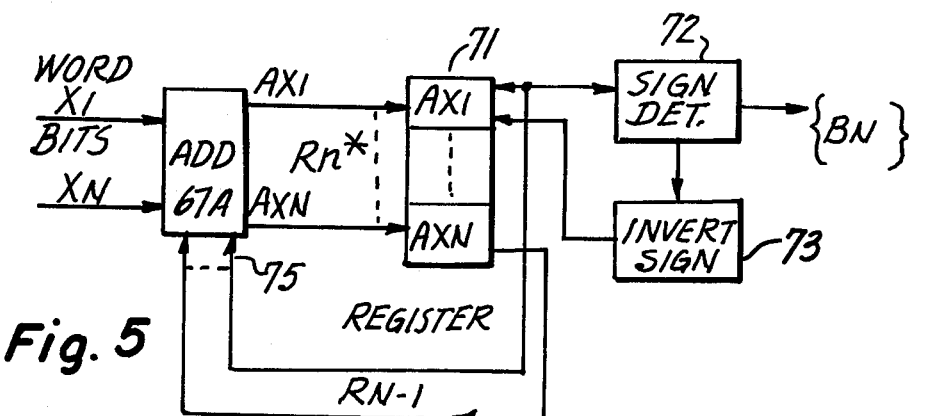
FIG. 5 is a block diagram of an alternate embodiment of a digital to analog converter according to this invention.

Referring to FIG. 5, it is seen that the combined action of the components of FIG. 4 can be implemented by using one register, one adder and a sign detector. An adder 67A which is a conventional digital adder, many examples of which can be found in the above reference text, receives the input bits $X_1$ to $X_n$, which as indicated in regard to the interpolator, are four bits constituting one word at a rate of 1.024 M words per second.

Essentially, the adder has its outputs coupled to the shift register 71. The shift register 71 is a conventional register which is designated as a parallel load edge triggered register and as such, consists of a plurality of cascaded multivibrators arranged in a shift register configuration for transferring data by the application of trigger pulses from one stage to the other. Configurations for such registers are well known in the art and examples of many suitable components in integrated form can be had by referring to the above noted text or to a text entitled PRACTICAL GUIDE TO INTEGRATED CIRCUITS by A. W. Barber, Parker Publishing Co. (1976), pages 78-79. The shift register 71 has stored in parallel, the bits $AX_1$ to $AX_n$, which essentially represents the $Rn^*$ number. The outputs from the shift register 71 are fed back to the input to the adder 67A where the output bn or sign bit is inverted and added to the next word, as will be explained.

The sign bit associated with the digital word is detected via the sign detector 72 and as explained above, the sign detector 72 will create a single pulse for each word when the first bit $AX_1$ is a one. If the first bit is a zero, the sign detector will provide at an output, a zero. It is understood that based on the above convention, a zero indicates a positive number, while a one indicates a negative number.

The output of the sign detector is coupled to an invert sign circuit 73 which essentially inverts a one output to a zero and a zero output to a one. The output of inverter 73 serves to change the sign of the first bit or the sign bit to therefore provide the signal $Rn_{-1}$, which signal is fed back to the adder 67A as shown in FIG. 5.

Essentially, the circuit shown in FIG. 5 is equivalent to the circuit shown in FIG. 4 and operates as follows:

For purposes of the present example, assume that the sequence has just started and all zeroes are stored in register 71. Assume that the incoming word consists of four bits which are all ones and that is the first word occuring at T=0. For purposes of this example, we will assume that all zeroes are added to the first word in adder 67A and hence, the word $Rn^*$ is all ones as applied to register 71. When register 71 is loaded, the sign detector operates to detect a one in stage $AX_1$. The one is indicative of a negative number and hence, the sign detector 72 produces an output pulse. The output pulse is inverted in sign by the inverter 73 which serves to change the output of stage $AX_1$ from a one to a zero. The new word which is 0111 is applied to the adder inputs and is indicative of the remainder $RN-1$. Thus the adder now has at the input 75, the number 0111. This number is added to the next word X to produce a second word $Rn^*$ to be applied to the register 71.

In the above example, if the second word were 1000, then the adder would produce the sign of 1111. This number would be transferred to register 71 which would again produce a pulse indicative of a negative number.

If is, of course, known from the above description that based on additions, one could have an overflow whereby the addition of two, four bit binary numbers may result in an output number having a one in the higher five bit position. This overflow condition can be easily accommodated and detected and one many change the sign of the fourth bit based on the overflow bit to again indicate a negative number.

If the $AX_1$ bit during any of the above described sequences, contains a zero, the sign detector will not produce a pulse; the absence of a pulse indicating a positive number. Accordingly, the output of the sign detector 72 provides a plurality of output pulses for all negative numbers and the absence of pulses for all positive numbers. The bit rate at the output of the sign detector constitutes one bit for each word X applied to the adder 67A. Hence, the bit rate from the sign detector 72 is at the word rate of 1.024 MHz. Thus, it can be seen that the bits produced by the sign detector constitute a large number of bits. These bits are applied directly to a low pass filter as 66 of FIG. 4 which may be a simple RC circuit arranged in an integrator configuration to provide an analog signal having a magnitude proportional to the bits produced by sign detector 72.

It is interesting to note that the sign detector does not respond to the weighted value of any binary word but merely responds to the sign of the word as being positive or negative. It can be shown, as will be further explained, that this is all that is required to convert a digital word such as X into an analog signal based on the use of the high sampling rate and based on the knowledge that the signal to be converted was originally a low pass signal indicative of the speech or voice band.

Figure 6:
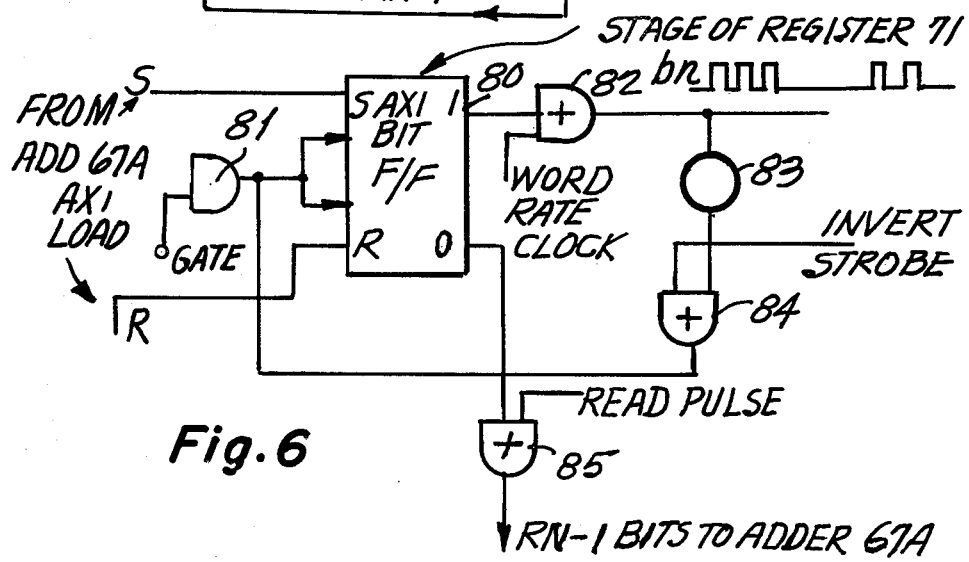
FIG. 6 is a schematic diagram of a sign detector and inverter which may be employed in this invention.

Referring to FIG. 6, there is shown a simple schematic diagram of the sign detector and inverter 72 and 73 of FIG. 5. The numeral 80 references a flip/flop which is indicative of the sign stage of register 71 or the AX bit. As seen, an input of the flip/flop is derived from a gate 81. The gate 82 has one input responsive to a gate pulse which is indicative of a loading condition.

The S and R inputs of flip/flop 80 are coupled to the one and zero outputs of the adder output stage indicative of bit $AX_1$. Hence, during the gate 81, the flip/flop 80 will be set to a one or zero position depending upon whether the output stage of the adder is at one or zero. Hence, the flip/flop 80 has stored therein a one indicative of a negative value word or a zero indicative of a positive value word.

After loading, a word rate clock is applied to AND gate 82. The other input of AND gate 92 is coupled to the one output of the flip/flop 80. If the output is a one indicative of a negative number, gate 82 will provide an output pulse indicating a one for the bn stream. Thus, the gate 82 functions as a sign detector and will provide an output pulse only when flip/flop 80 is set to one. If flip/flop 80 is set to zero, no pulse will be provided during the word rate clock and hence, the output of gate 82 will be at a zero.

The output pulse is applied via the inverter 83 to an AND gate 84 which operates as a sign inverter. AND gate 84 provides a trigger for flip/flop 80 during the presence of a one at the output. If gate 82 provides a one, gate 84 will provide a strobe at the output which is applied to the trigger input of flip/flop 80 and will change the state of the flip/flop from one to zero. The state of the flip/flop and all stages in the register 71 are read out and applied to the adder inputs at lead 75 wherein the $Rn-1$ signal is added to the next word in sequence. The reading is accomplished by gate 85 which strobes either output of flip/flop 80 to produce a signal for the adder 67A of the proper polarity to be added to the next input word as described.

It can be seen from above that this is only one way of implementing the circuitry described in FIG. 5 for the sign detector and inverter and many other ways are available utilizing various clock formats and so on to produce the operation described and indicated in conjunction with FIGS. 4 and 5.

Figure 7A:
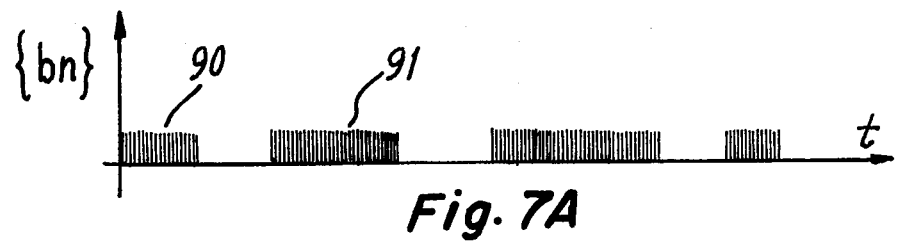
FIGS. 7A and 7B are waveforms describing the nature of the digital to analog conversion process.
Figure 7B:
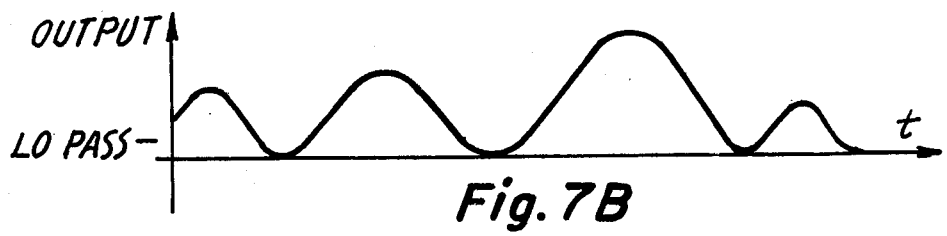

Referring to FIGS. 7A and 7B, there is shown in FIG. 7A, a graphic output indicative of bn or the output of the sign detector 72. As one can see, the output consists of a plurality of pulses indicative of the detection by sign detector 72 of a negative number. Based on the nature of the analog signal which was converted to a digital signal, a particular representation of a possible signal is shown in FIG. 7A. It is understood, of course, that it is not drawn to scale.

Each pulse which forms the block of pulses as 90 and 91 of FIG. 7A is of a width determined by the word rate clock applied to gate 82. The number of pulses in a block as 90 is a function of the sign bit of the incoming digital signal X as modified by the feedback loop associated with the digital to analog converter of FIGS. 4 and 5.

As indicated, the output of these pulses is applied to a low pass filter. The low pass filter produces a signal as shown in FIG. 7B which approximates an analog output having durations and magnitudes depending upon the number of pulses in each block. Integration of a pulse stream at the high repetition rate as shown in FIG. 7A is well within the ken of one skilled in the art. The signal shown in 7B is an audio signal indicative of speech.

With the above discussion in mind, one is now advised that a digital to analog converter for use in a communications system such as a telephony system has to operate effectively, but must provide good noise operation to thereby assure that undue noise is not applied to the subscriber circuit when the digital signal is converted to an analog signal.

For purposes of analysis and for a still clearer understanding of the operation and theory behind the D/A converter shown in FIGS. 4 and 5, it will be seen that the converter is a digital sigma-delta modulator. The term sigma-delta modulation is employed herein to best describe the digital to analog converter shown in FIGS. 4 and 5 and as the D/A converter 53 of FIG. 1. The operation of this converter approximates the known analog principle of a sigma-delta modulator in regard to mode implementation, whereas the noise operation and theory of operation of the circuit shown in FIGS. 4 and 5 can be mathematically investigated.

Figure 8:
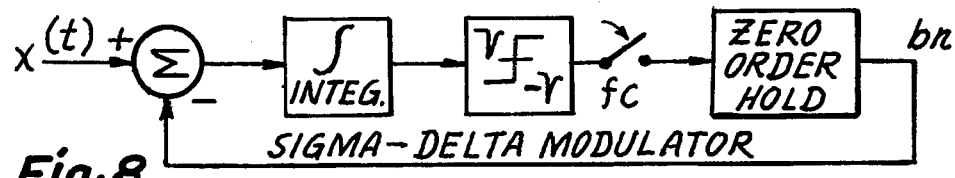
FIG. 8 is a simplified block diagram of an analog sigma-delta modulator useful in explaining the operation of the invention.

A basic scheme for the analog sign is shown in FIG. 8. The input signal X(t) is an analog signal, bandwidth limited between $-f_o$ and $+f_o$ having an amplitude of less than $\tau$. The output has a pulse stream of amplitude $\gamma$ and a pulse width $(1/f_c)$, where $f_c$ is the clock frequency or sampling rate. An analog signal y(t) can be reconstructed by passing the pulse stream bn through a low pass filter. The signal y(t) is a close approximate to $x_t$ if the clock frequency $f_c$ is much greater than $f_o$.

Figure 9:
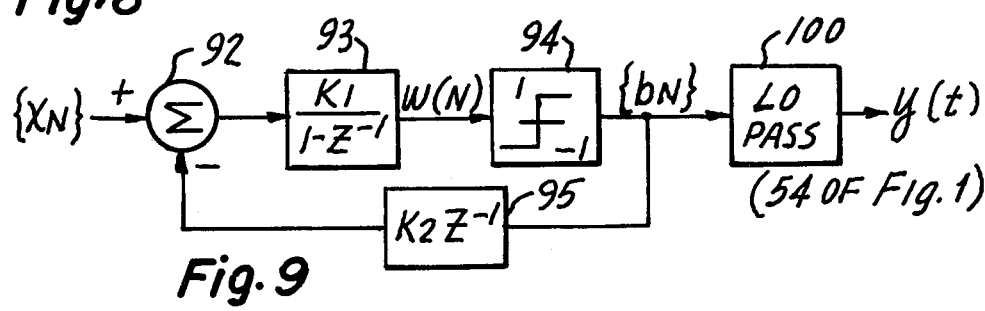
FIG. 9 is a block diagram depicting the analysis of the digital to analog converter according to this invention.

FIG. 9 depicts a block diagram of a digital sigma-to-delta converter according to this invention and which block diagram serves as an absolute true model for the configurations depicted in FIGS. 4 and 5. The input signal $\{X_n\}$ is a digital signal which, for example, may be a PCM signal having a plurality of digital words, where each digital word represents a weighted value of an analog signal which was sampled and converted to a digital signal.

Essentially, the digital word, as indicated, in conjunction with FIGS. 4 and 5 is a three bit or four bit word derived from the output of the interpolator. In any event, the modulator will work with greater numbers of bits and different word rates other than those described.

As indicated, in conjunction with FIGS. 1, 4 and 5, the input to the D/A converter as 53 is obtained from an interpolator. The interpolator functions to increase the output word rate from the filter 50 and gain control 51 (32 KHz at 13+ bits/word) to 1.024 MHz at three or more bits/word. Hence, the input signal $\{X_n\}$ is at 1.024 MHz at three or more bits per word. The signal $\{X_n\}$ is to be converted into the pulse stream $\{b_n\}$ which is applied to the input of the low pass filter 60 to derive the analog signal y(t) at the output. This signal, as seen in FIG. 1, is applied to the hybrid 16 for application to the subscriber A.

The word stream $\{X_n\}$ is to be interpreted as 2's complement binary numbers. The association of binary word and numerical value is:

$$X_n \Longleftrightarrow (b_0, b_1, b_2, \ldots b_m)$$

$$X_n = -b_0 + \sum_{i=i}^{m} b_i 2^{-i}$$

If $|X_n| \leq 1$, the outputs are $\pm$, i.e. Y=1.

Thus, the input digital signal is applied to the input of a summer circuit 92. The summing circuit or adder 92 is equivalent to adders 67 and 67A of FIGS. 4 and 5. The output of the adder 92 is applied to the input of a module 93 having a transfer function:

$$\frac{K_1}{1 - Z^{-1}}$$

Essentially, the digital transfer function referenced in module 93 is generally derived as follows:

The sampled data equivalent of the sigma to delta modulator shown in FIG. 8 is obtained for a "zero order hold" or a rectangular hold. FIG. 8 can be analyzed for a particular sampling rate as shown in FIG. 9. The constants $K_1$ and $K_2$ depend upon the sampling rate, integrator gain and the step size used in the D/A converter.

Figure 10:
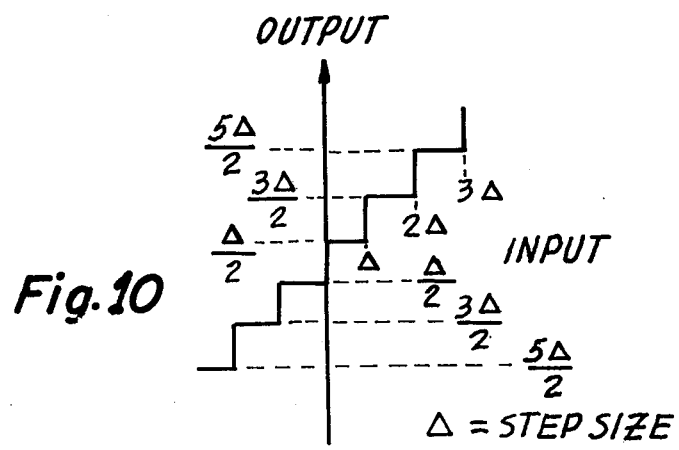
FIG. 10 is a waveform generally depicting a midriser input-output characteristic showing a type of quantizing employed by the converter.

Essentially, module 94 is a quantizer which is of the mid-riser type as shown in FIG. 10 (INPUT-OUTPUT). To prevent overload of the quantizer 94, its input W(n) must be restricted in amplitude to:

$$|W(n)| < 2^{n-1}\Delta$$

where $\Delta$ equals the step size.

The quantized signal b(n) is restricted in amplitude to:

$$|b(n)| \leq (2^{N-1} - 0.5)\Delta$$

and the instantaneous quantization error e(n)

$$e(n) = W(n) - b(n)$$

This is bounded by:

$$|e(n)| \leq \frac{\Delta}{2}$$

The input to output transfer function for the modulator of FIG. 3 is:

$$H_{io}(Z) = \frac{K_1}{1 + (K_1 K_2 - 1) Z^{-1}}$$

The noise transfer function is:

$$H_N(Z) = \frac{1 - Z^{-1}}{1 + (K_1 K_2 - 1) Z^{-1}}$$

If, $K_1 K_2 = 1$ or are close to one, then the noise transfer function is:

$$H_N(Z) = 1 - Z^{-1}$$

Thus, the noise transfer function indicates that the modulator of FIG. 8 tends to move noise power out of the voice band. This action is desirable in telephone systems. Hence, one selects $K_1 = 1$ and $K_2 = 1$ for the modulator. In this manner, the product $K_1 \cdot K_2$ also equals one. This, therefore satisfies the requirements for good noise rejectability.

One assumes that the quantization error en is white noise. This assumption is correct in that the sampling rate is much greater than the upper (cut off) frequency of the bandwidth, and step size $\Delta$ is quite large.

It can then be mathematically shown that the noise power varies as the cube of the cut off frequency to sampling frequency ratio. From such considerations, the signal to noise ratio (SNR) increases 6 db for each additional bit and the SNR increases 9 db per octave increase in sampling frequency or clock rate. Hence, these considerations dictate that a sampling rate of 1.024 MHz at three or more bits will provide an extremely efficient input to the modulator configuration derived from FIG. 9, and the noise operation is completely compatible with the requirements of a telephone communications system.

The modules 93 and 94 represent the functions performed by the sign detector 68 of FIG. 4, for example. The feedback transfer function indicated in module 95 is analogous to the transfer function 70 of FIG. 4 which has been also explained in conjunction with FIG. 5. In this manner, in using the model shown in FIG. 9, one can calculate the noise performance as well as making a complete stability analysis of the entire digital to analog converter employed.

As can be ascertained, the digital converter described in FIGS. 4 and 5 operates in synchronism with the clock rate employed in the line circuit. Since the converter has an internal register, the input digital code or word consisting of n bits can change between clock pulses without effecting the analog output. The digital to analog converter provides a voltage output as described, via the low pass filter and at a negligible output impedance.

Functionally, the input code, as explained, is sampled on the rising edge of the clock and a voltage determined by this code is manifested by the output of the sign detector over the entire sampling interval.

As indicated above, stability analysis as well as noise performance of the modulator when considered with the nature of the input signal from the interpolator have been mathematically analyzed and the above noted representations concerning stability and noise performance have been proven, both mathematically and experimentally. Hence, the digital to analog converter is an extremely simple and flexible circuit, which circuit completely eliminates the need for a rate multiplier. In this manner, the D/A converter can be implemented using conventional integrated circuit modules and can be specified and built together with the other digital components for a digital line circuit. Therefore, the use of such a converter in conjunction with a telephone switching system enables one to achieve significant reduction in costs in supplying the multiplicity of line circuits required in a digital telephone switching system.

Various modifications and alternative embodiments will become apparent to those skilled in the art in reviewing the above noted application such as different interpolating schemes as well as employing other various digital codes indicative of analog signals which can be processed back to an analog signal by the above noted converter. All such modifications and alternate embodiments are deemed to be encompassed within the scope and breadth of the claims appended hereto.

We claim:

1. A telephone subscriber line circuit for coupling a subscriber to a digital transmission path in a telephone switching system comprising in combination:

two-to-four wire converter means coupled to a near-end subscriber line to provide a transmit path and a receive path for said line, analog-to-digital converter means for converting near-end analog signals coupled thereto from said two-to-four wire converter in said transmit path, said converter means operative to provide a digital signal comprising a plurality of digital words, each having the same number of bits with each word manifesting a weighted value of said near-end analog signal, with at least one bit in each word indicative of a sign bit indicating whether said word and therefore said weighted value of said analog signal is positive or negative, means for applying said digital signal to said digital transmission path, means coupled to said digital transmission path adapted to receive a far end digital signal of the same format as said applied digital signal, interpolator means responsive to said digital signal as received for providing a second digital signal having a lesser number of bits than said far digital signal and an increased word rate, digital to analog converter means in said receive path of said line circuit and coupled to said interpolating means to provide an analog signal, said converter means comprising:

adding means for receiving said second digital signal and adding to each word of said signal an error signal, to provide at an output, a modified word having a given number of bits including a sign bit manifesting the sum of a word in said second digital signal as modified by said error signal, sign detecting means responsive to said modified word for providing an output pulse when the sign of said word is indicative of one value as positive or negative, said output pulse indicative of the value of said analog signal as being positive or negative, feedback control means responsive to the sign of said modified word as detected for inverting said sign and adding the same to said modified word to provide said error signal for application to said adding means to cause each successive digital word as applied to said adding means to be modified by said error signal as based on the sign of said previous modified word, to cause said sign detecting means to provide said output pulse for each word in said second digital signal having the same sign bit, low pass filter means coupled to said sign detecting means for providing a replica of said analog signal as derived from said far end digital signal, means for coupling said far end analog signal to said two or four wire converter means to enable a subscriber to receive and therefore respond to said far end analog signals.

2. The telephone line circuit according to claim 1 wherein said far end digital signal as received by said interpolating means is at a 32 KHz word rate with each word having thirteen bits, the output of said interpolating means being at a 1 MHz word rate with each word being at least three bits and less than thirteen.

3. The telephone line circuit according to claim 1 wherein said analog signals are voice signals having bandwidths relatively between 0 to 4 KHz.

4. The telephone line circuit according to claim 1 further including:

a decimator coupled to the output of said analog to digital converter in said transmit path for reducing the word rate of said digital signal at said output to provide a decimated digital signal for application to said digital transmission path.

5. The telephone line circuit according to claim 4 wherein said decimated signal has a word rate at 32 Khz.

* * * * *